(12) United States Patent
Sakai et al.

(10) Patent No.: US 8,985,747 B2
(45) Date of Patent: Mar. 24, 2015

(54) PIEZOELECTRIC ELEMENT, LIQUID EJECTING HEAD, LIQUID EJECTING APPARATUS AND PIEZOELECTRIC DEVICE

(71) Applicant: Seiko Epson Corporation, Tokyo (JP)

(72) Inventors: Tomohiro Sakai, Matsumoto (JP); Tatsushi Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/464,170

(22) Filed: Aug. 20, 2014

(65) Prior Publication Data

US 2015/0054888 A1    Feb. 26, 2015

(30) Foreign Application Priority Data

Aug. 22, 2013    (JP) ................. 2013-172617

(51) Int. Cl.
  B41J 2/045       (2006.01)
  H01L 41/187      (2006.01)
  H01L 41/047      (2006.01)
  B41J 2/14        (2006.01)

(52) U.S. Cl.
  CPC ........ H01L 41/1873 (2013.01); H01L 41/0472 (2013.01); H01L 41/1878 (2013.01); B41J 2/14201 (2013.01)
  USPC .......................................... 347/68; 310/358

(58) Field of Classification Search
  CPC .... B41J 2/14233; B41J 2/1609; B41J 2/1612; B41J 2/14209; B41J 2/1618; B41J 2002/14258; B41J 2202/10; B41J 2/045; H01L 41/083; H01L 41/18; H01L 41/0471
  USPC .......... 347/68–72; 29/25.35, 890.1; 310/311, 310/324, 358
  See application file for complete search history.

(56) References Cited

U.S. PATENT DOCUMENTS

| 7,614,128 | B2* | 11/2009 | Kamei | 29/25.35 |
| 8,678,563 | B2* | 3/2014 | Itayama | 347/68 |
| 8,704,429 | B2* | 4/2014 | Yabuta et al. | 310/358 |
| 2007/0241642 | A1 | 10/2007 | Miyazawa | |

FOREIGN PATENT DOCUMENTS

| JP | 2004-066600 | 3/2004 |
| JP | 2007-287745 | 11/2007 |
| JP | 2011-238774 | 11/2011 |

* cited by examiner

Primary Examiner — An Do
(74) Attorney, Agent, or Firm — Workman Nydegger

(57) ABSTRACT

Provided is a piezoelectric element that has a first electrode, a piezoelectric layer provided on the first electrode, and a second electrode provided on the piezoelectric layer, an average grain size of crystal grains aligned in a planar direction within 15° from a (100) plane is less than the average grain size of the crystal grains facing a planar direction inclined by more than 15° from the (100) plane, in a case in which the crystal orientation of the piezoelectric layer is analyzed using an electron beam backscatter diffraction method (EBSD).

10 Claims, 13 Drawing Sheets

PIEZOELECTRIC ELEMENT, LIQUID EJECTING HEAD, LIQUID EJECTING APPARATUS AND PIEZOELECTRIC DEVICE

BACKGROUND

1. Technical Field

The present invention relates to a piezoelectric element, liquid ejecting head, a liquid ejecting apparatus, and a piezoelectric device.

2. Related Art

Representative examples of piezoelectric elements used in piezoelectric devices such as liquid ejecting heads exhibiting an electromechanical transduction function, comprises two electrodes and a piezoelectric layer formed from a crystallized dielectric material provided between two electrodes.

There is demand for excellent piezoelectric characteristics in the piezoelectric material used in the piezoelectric layer that configures such a piezoelectric element. In order for the piezoelectric characteristics of the piezoelectric layer to be sufficiently realized, alignment in the (100) plane is desirable when the crystallinity is a rhombohedral system. For example, a manufacturing method of a piezoelectric element in which a piezoelectric layer formed from lead zirconate titanate is formed via a lead titanate layer on a lower electrode in order for lead zirconate titanate (PZT) to be aligned in the (100) plane has been disclosed (for example, refer to JP-A-2011-238774). A technology has been disclosed in which lanthanum nickel oxide (LNO) is used as an alignment control layer that controls the crystal alignment of the piezoelectric layer (for example, refer to JP-A-2004-066600).

However, in order for the piezoelectric characteristics of the piezoelectric element to be more significantly improved, not only is the crystals of the piezoelectric layer being simply aligned in the (100) plane, but also further research into size and distribution state of the crystal grains is necessary.

Meanwhile, there is demand from an environmental point of view for a piezoelectric material without lead or in which the content of lead is suppressed. Although there are $BiFeO_3$-based piezoelectric materials that contain Bi and Fe as piezoelectric materials that do not contain lead (for example, refer to JP-A-2007-287745), the problem of alignment is also present in such a piezoelectric material. In either case, it is desirable to realize a piezoelectric layer in which the degree of alignment of the (100) plane is further improved.

Such a problem is present not only in piezoelectric element used in a liquid ejecting head, such as an ink jet recording head, but also to the other piezoelectric devices.

SUMMARY

An advantage of some aspects of the invention is to provide a piezoelectric element having a piezoelectric layer with an improved degree of alignment of the (100) plane, and to provide a liquid ejecting head, a liquid ejecting apparatus, and a piezoelectric device including the improved piezoelectric element.

According to an aspect of the invention, there is provided a piezoelectric element which includes a first electrode; a piezoelectric layer provided on the first electrode; and a second electrode provided on the piezoelectric layer. In a case in which the crystal orientation of the piezoelectric layer is analyzed using an electron beam backscatter diffraction method (EBSD), an average grain size of crystal grains aligned in a planar direction within 15° from a (100) plane is less than the average grain size of the crystal grains facing a planar direction inclined by more than 15° from the (100) plane.

In this case, it is possible to provide a piezoelectric element having a piezoelectric layer in which the degree of alignment of the (100) plane is improved by the average grain size of the crystal grains aligned in a planar direction within 15° from the (100) plane is smaller than the average grain size of the crystal grains facing a planar direction inclined by more than 15° from the (100) plane.

It is preferable that the average grain size of the crystal grains aligned in the planar direction within 15° from the (100) plane be less than 100 nm, and the average grain size of the crystal grains facing a planar direction inclined by more than 15° from the (100) plane be 100 nm or more. Accordingly, because the grain size of the crystal grains aligned in a planar direction within 15° from the (100) plane is minutely small, the degree of alignment of the (100) plane of the piezoelectric layer is further improved.

It is preferable that 50% or more of the crystal grains aligned in the planar direction within 15° from the (100) plane have a grain size of less than 70 nm, and 14% or less of the crystal grains facing a planar direction inclined by more than 15° from the (100) plane have a grain size of 100 nm or more. Accordingly, because the grain size of the crystal grains aligned in a planar direction within 15° from the (100) plane are still more minutely small, the degree of alignment of the (100) plane of the piezoelectric layer is further improved.

It is preferable that the piezoelectric element further comprises a buffer layer provided between the piezoelectric layer and the first electrode, and the buffer layer includes bismuth and manganese. Accordingly, the piezoelectric layer strongly aligned in the (100) plane can be easily prepared by providing the piezoelectric layer on a buffer layer that includes bismuth and manganese.

It is preferable that the piezoelectric layer have a perovskite structure that includes bismuth, iron, barium, and titanium. Accordingly, a piezoelectric layer with a perovskite structure that has a high degree of alignment of the (100) plane can be easily prepared.

It is preferable that the piezoelectric layer further include manganese. Accordingly, improvements in the leak characteristics of the piezoelectric layer can be achieved.

It is preferable that a ratio between a number of crystal grains aligned in a planar direction within 15° from the (100) plane and a number of crystal grains facing a planar direction inclined by more than 15° from the (100) plane (number of crystal grains facing within 15° from the (100) plane/number of crystal grains inclined by more than 15° from the (100) plane) be 2.8 or more.

Accordingly, the density of the crystallinity can be excellent, and a piezoelectric layer more strongly aligned in the (100) plane can be prepared.

According to another aspect of invention, there is provided a liquid ejecting head including the piezoelectric element, a liquid ejecting apparatus including the liquid ejecting head of the aspects, or a piezoelectric device including the piezoelectric element.

In this case, it is possible to provide a liquid ejecting head, a liquid ejecting apparatus, or a piezoelectric device, having a piezoelectric layer in which the degree of alignment of the (100) plane is improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
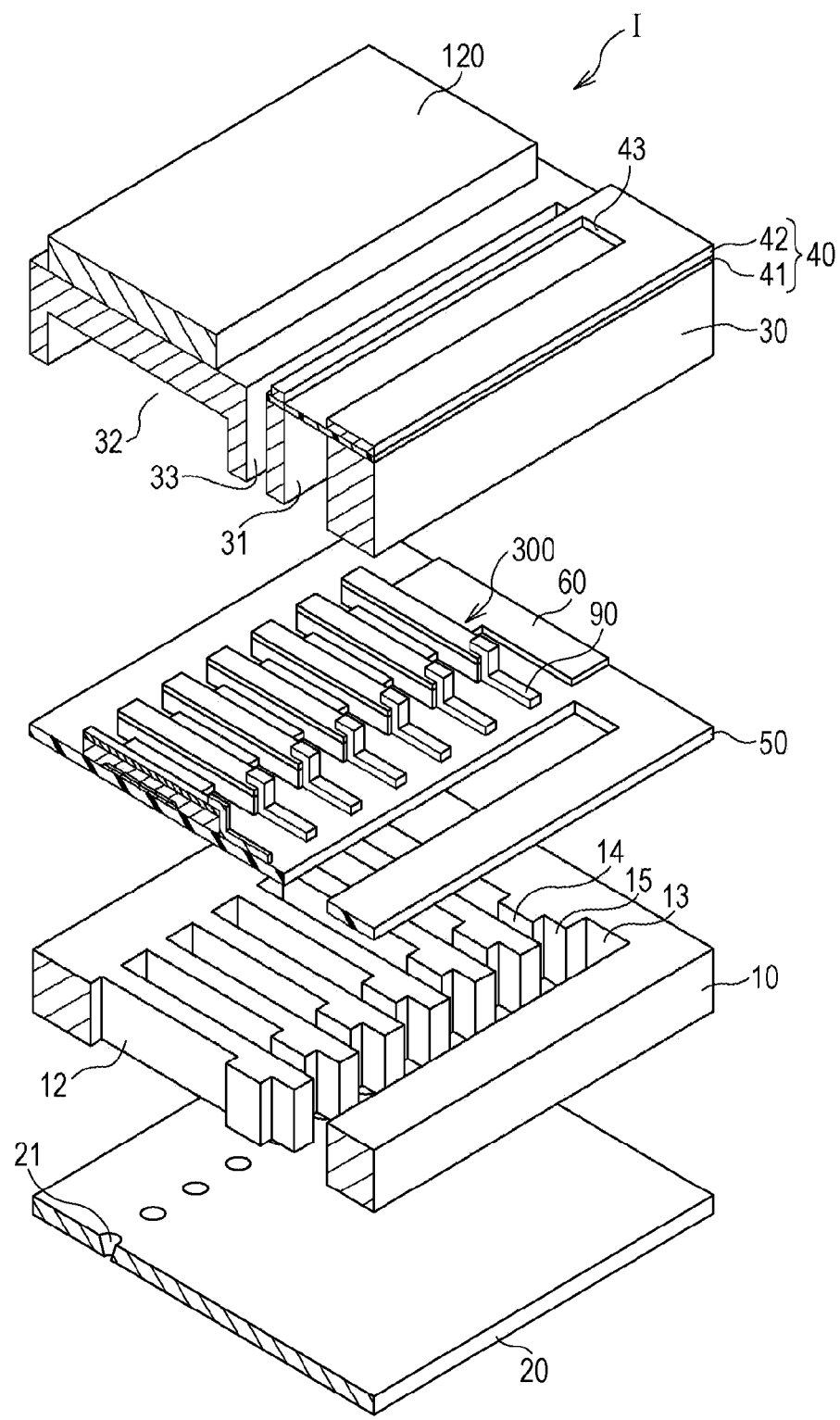
FIG. 1 is an exploded perspective view showing a schematic configuration of the recording head according to Embodiment 1.
Figure 2:
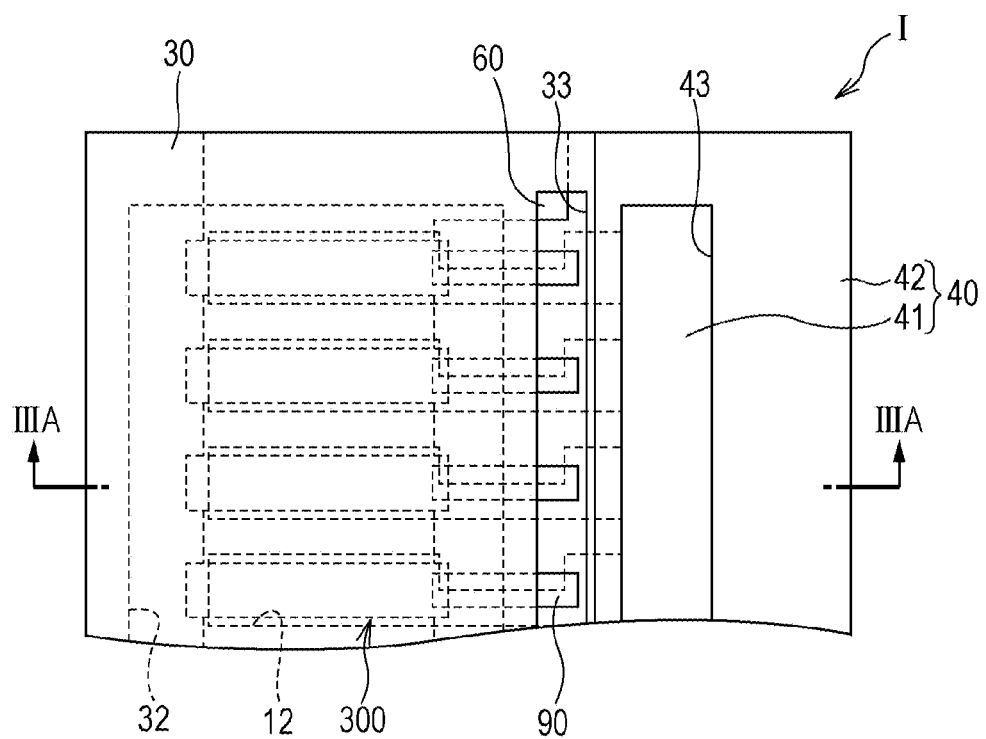
FIG. 2 is a plan view of the recording head according to Embodiment 1.
Figure 3A:
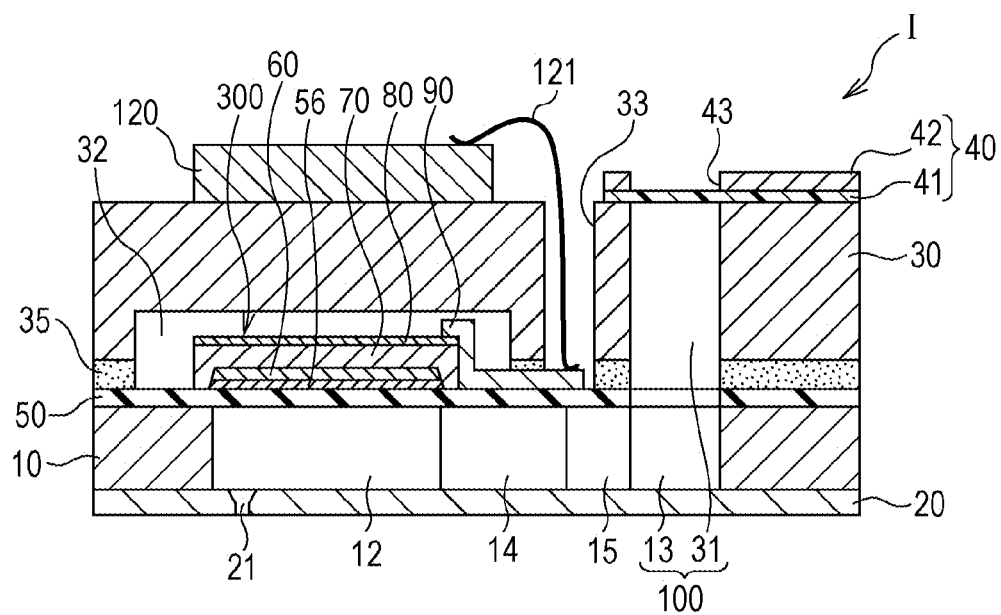
FIG. 3A is a cross-sectional view of the recording head according to Embodiment 1.
Figure 3B:
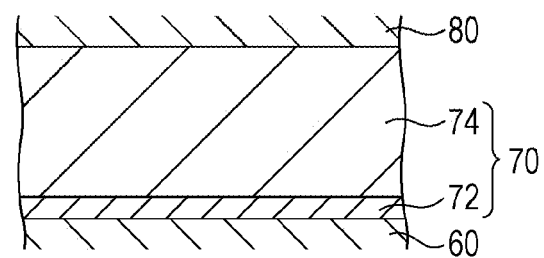
FIG. 3B is an enlarged cross-sectional view of the main portions of the recording head according to Embodiment 1.

FIG. 1 is an exploded perspective view showing a schematic configuration of an ink jet recording head that is one example of the liquid ejecting head manufactured by the manufacturing method according to Embodiment 1 of the invention; FIG. 2 is a plan view of FIG. 1; FIG. 3A is a cross-sectional view along line IIIA-IIIA in FIG. 2; and FIG. 3B is an enlarged cross-sectional view of the main portions in FIG. 3A. As shown in FIGS. 1 to 3B, a flow channel forming substrate 10 of the present embodiment is formed from a silicon single crystal substrate and has an elastic film 50 made of silicon dioxide formed on one surface thereof.

A plurality of pressure generating chambers 12 are provided in parallel in the width direction in the flow channel forming substrate 10. A communication portion 13 is formed in an outside region in the longitudinal direction of the pressure generating chambers 12 of the flow channel forming substrate 10, and the communication portion 13 and each of the pressure generating chambers 12 are communicated with each other via an ink supply channel 14 and a communication channel 15 provided at each of the pressure generating chambers 12. The communication portion 13 configures a portion of a manifold which is an ink chamber of common to each pressure generating chamber 12 by being communicated with a manifold portion 31 of a protective substrate described later.

The ink supply channel 14 is formed to have a narrower width than the pressure generating chamber 12, and maintains the resistance to be constant in the flow channel of ink flowing into the pressure generating chamber 12 from the communication portion 13. Although the ink supply channel 14 is formed by narrowing the width of the flow channel from one side in the present embodiment, the ink supply channel may be formed by narrowing the width of the flow channel from both sides. The ink supply channel may also be formed by narrowing the flow channel in the thickness direction rather than narrowing the width of the flow channel. In the present embodiment, a liquid flow channel formed from the pressure generating chamber 12, the communication portion 13, the ink supply channel 14, and the communication channel 15 are provided on the flow channel forming substrate 10.

A nozzle plate 20 in which nozzle openings 21 are punctured that communicate with the vicinities of the end portions on the opposite side to the ink supply channel 14 in each pressure generating chamber 12 is fixed to the opening surface side of the flow channel forming substrate 10 by an adhesive, a thermally weldable film, or the like. The nozzle plate 20 is formed from, for example, a glass ceramic, a silicon single crystal substrate, stainless steel, or the like.

On the other hand, the elastic film 50 as described above is formed on the opposite side to the opening surface of the flow channel forming substrate 10, and an adhesive layer 56 formed from, for example, titanium oxide with a thickness of approximately 30 nm to 50 nm or the like is provided on the elastic film 50 in order to improve the adhesiveness of the elastic film 50 and the like with the foundation of the first electrode 60. An insulating film formed from zirconium oxide or the like may be provided on the elastic film 50 as necessary.

Furthermore, the first electrode 60 formed from platinum (Pt), the piezoelectric layer 70 formed from a buffer layer 72 which is a complex oxide including bismuth and manganese, and a complex oxide layer 74 with a perovskite structure described later, and the second electrode 80 are laminated on the adhesive layer 56, thereby configuring a piezoelectric element 300 as pressure generating means generating a change in the pressure in the pressure generating chamber 12. Here, the piezoelectric element 300 refers to a portion including the first electrode 60, the piezoelectric layer 70, and the second electrode 80. In general, any one of the electrodes in the piezoelectric element 300 is made a common electrode, and the other electrode and the piezoelectric layer 70 are configured by being patterned for each of the pressure generating chambers 12.

Although the first electrode 60 is used as the common electrode of the piezoelectric element 300, and the second electrode 80 is used as the individual electrode of the piezoelectric element 300 in the present embodiment, there is no impediment to reversing this for convenience in a driving circuit or wiring. Here, the piezoelectric element 300 and a diaphragm which is displaced through driving of the piezoelectric element 300 will be collectively referred to as an actuator device. The elastic film 50, the adhesive layer 56, the first electrode 60, and the insulating film which is provided as necessary act as the diaphragm in the above-described example, the embodiment is naturally not limited thereto, and, for example, the elastic film 50 or the adhesive layer 56 may be not provided. The piezoelectric element 300 itself may be set to substantially serve as the diaphragm. However, in a case in which the first electrode 60 is provided directly on the flow channel forming substrate 10, it is preferable that an insulating protective film, or the like, protect the first electrode 60 such that the first electrode 60 and the ink do not conduct with one another.

The buffer layer 72 of the embodiment is a complex oxide including bismuth and manganese. More specifically, the A site is coordinated with 12 oxygen atoms, and additionally the B site is coordinated with 6 oxygen atoms in an $ABO_3$ structure, thereby forming an octahedron. It is preferable that the complex oxide that configures the buffer layer 72 be more specifically formed from Bi at the A site and Mn at the B site. It is preferable that the bismuth and manganese be represented as a molar composition ratio of bismuth:manganese=100:50 to 100:200.

For the buffer layer 72, there is a possibility of diffusion of the component elements occurring between complex oxide layers 74 when firing a plurality of complex oxide layers 74, and a possibility of completely separated layers not being detected; however, it is possible, for example, to confirm the presence of regions with a high concentration of Bi, Mn on the first electrode side of the piezoelectric layer 70, thereby confirming the presence of the buffer layer 72. It is preferable that the thickness of the buffer layer 72 be as thin as possible, and the thickness is preferably 20 nm or less, for example.

The buffer layer 72 formed in such a configuration acts as an alignment control layer that causes the crystals of the piezoelectric layer 70 with a perovskite structure formed on the buffer layer 72 to be strongly aligned in the (100) plane. Here, the wording "crystals being strongly aligned in the (100) plane" includes a case in which all of the crystals are aligned in the (100) plane, and a case in which the crystals are preferentially aligned in the (100) plane.

Because various physical characteristics, such as the amount of displacement, the dielectric constant, and the Young's modulus of the piezoelectric layer 70, that is, the piezoelectric body, differ according to the crystal orientation, a case in which the alignment of the piezoelectric body is strongly aligned in an arbitrary direction or becomes nearly uniform is better able to exhibit the characteristics of the piezoelectric body than a case in which the orientation of the piezoelectric body becomes random or a case in which a plurality of alignments are mixed. In particular, the piezoelectric layer 70 strongly aligned in the (100) plane is a film in which the occurrence of cracking is suppressed, and is thereby able to exhibit superior piezoelectric characteristics.

Not only is the piezoelectric layer 70 of the embodiment a film strongly aligned in the (100) plane, but also has a significantly improved degree of alignment in the (100) plane. More specifically, the average grain size of crystal grains aligned in a planar direction within 15° from the (100) plane is less than the average grain size of the crystal grains facing a planar direction inclined by more than 15° from the (100) plane in a case in which the crystal orientation of the piezoelectric layer 70 is analyzed using an electron beam backscatter diffraction method (EBSD). In this way, by making the crystal grains of a planar direction that that substantially matches the (100) plane minutely small, the crystallinity of the piezoelectric layer 70 become excellent, and the degree of alignment of the (100) plane of the piezoelectric layer 70 is improved.

In more detail, it is preferable that the average grain size of the crystal grains aligned in the planar direction within 15° from the (100) plane be less than 100 nm, and the average grain size of the crystal grains facing a planar direction inclined by more than 15° from the (100) plane be 100 nm or more. In so doing, the crystal grains in the planar direction substantially matching the (100) plane become still more minutely small, and the crystallinity of the piezoelectric layer 70 becomes favorably dense. As a result, the degree of alignment of the (100) plane of the piezoelectric layer 70 further improves.

It is preferable that 50% or more of the crystal grains aligned in the planar direction within 15° from the (100) plane have a grain size of less than 70 nm, and 14% or less of the crystal grains facing a planar direction inclined by more than 15° from the (100) plane have a grain size of 100 nm or more. In so doing, 50% or more of the crystal grains in the planar direction substantially matching the (100) plane have a grain size of less than 70 nm, and, thereby, the crystal grains are made still finer. As a result, the degree of alignment of the (100) plane of the piezoelectric layer 70 is further improved.

It is preferable that the ratio of the number of crystal grains aligned in a planar direction within 15° from the (100) plane and the number of crystal grains facing a planar direction inclined by more than 15° from the (100) plane (number of crystal grains facing within 15° from the (100) plane/number of crystal grains inclined by more than 15° from the (100) plane) be 2.8 or more. In so doing, the density of the crystallinity becomes excellent. As a result, the degree of alignment of the (100) plane of the piezoelectric layer 70 is more significantly improved.

The orientation of the crystal grains is observed in an orientation mapping obtained by crystal orientation analysis using an electron beam backscatter diffraction method (EBSD). The grain size of the crystal grains (hereinafter, referred to as crystal grain size) is obtained through image analysis of the orientation mapping. The distribution state of the crystal grain size is visually represented by a grain size histogram described later (refer to FIG. 12), and the average grain size and standard deviation are calculated in light of the grain size histogram.

Such a piezoelectric layer 70 is a complex oxide having a perovskite structure including bismuth, iron, barium and titanium. The perovskite structure has an $ABO_3$ structure, and the A site is coordinated with 12 oxygen atoms, and the B site is coordinated with 6 oxygen atoms, thereby forming an octahedron. Bi and Ba are located in the A site, and Fe and Ti are located in the B site. Examples of the complex oxide layer 74 include, for example, a complex oxide having a mixed crystal perovskite structure of bismuth ferrate and barium titanate, or a solid solution in which bismuth ferrate and barium titanate are evenly solid soluted; however, there is no limitation to this range. The bismuth ferrate and barium titanate are not detected singly in an X-ray diffraction pattern.

The bismuth ferrate and barium titanate are known piezoelectric materials respectively having a perovskite structure, and various configurations of each are known. For example, although compositions other than $BiFeO_3$ and $BaTiO_3$ in which elements (Bi, Fe, Ba, Ti, O) are partially deficient or excessive, or in which a part of the element is substituted with another element are known as bismuth ferrate and barium titanate, where bismuth ferrate and barium titanate are represented in the invention, compositions in which there is deviation from the stoichiometric composition due to deficiency or excess, or in which a portion of the elements is substituted with another element, are included in the range of bismuth ferrate and barium titanate. Various changes to the ratio of bismuth ferrate and barium titanate are also possible.

The composition of the complex oxide layer 74 formed from a complex oxide having a perovskite structure including Bi, Fe, Ba and Ti is represented by $((Bi, Ba)(Fe, Ti)O_3)$. As a representative example, the composition is represented by a mixed crystal represented by the following general formula (1). It is possible to represent this formula (1) with the following general formula (1'). Here, the description of the general formula (1) and the general formula (1') is a composition expression based on stoichiometry, and, as described above, as long as a perovskite structure is obtainable, the inevitable composition deviation due to lattice mismatch, oxygen loss, and the like is naturally allowed, as well as partial substitution or the like of the elements. For example, if the stoichiometric ratio is set as 1, compositions in the range of 0.85 to 1.20 are allowed. Even with different compositions in a case represented by the general formula as below, compositions in which the ratio of the elements of the A site and the elements of the B site are the same may be regarded as the same complex oxide.

(1)

(0<x<0.40)

(1')

(0<x<0.40)

In a case in which the complex oxide layer 74 is a complex oxide with a perovskite structure including Bi, Fe, Ba and Ti, elements other than Bi, Fe, Ba and Ti may be further included. Examples of the other elements include Mn, Co, Cr, or the like. In a case in which the complex oxide layer 74 includes Mn, Co or Cr, the composition of the complex oxide layer 74 is represented as $((1-x) [Bi(Fe_{1-y}M_y)O_3]-x [BaTiO_3]$ (where M is Mn, Co or Cr)). In this case, the Mn, Co and Cr are a complex oxide with a structure positioned at the B site. For example, in a case where Mn is included, the complex oxide that configures the complex oxide layer 74 is represented as a complex oxide having a structure in which a portion of Fe of a solid solution in which bismuth ferrate and barium titanate are evenly solid soluted is substituted with Mn, or a perovskite structure of a mixed crystal of bismuth manganate ferrite and barium titanate, and the basic characteristics are the same as the complex oxide having a perovskite structure of a mixed crystal of bismuth ferrate and barium titanate; however, it is understood that the leakage characteristics are improved.

The thickness of the complex oxide layer 74 is not limited. For example, the thickness of the complex oxide layer 74 is 3 μm or less, and preferably 0.3 μm to 1.5 μm.

A lead electrode 90 formed from, for example, gold (Au) or the like, which is drawn from the vicinity of the end portion on the ink supply channel 14 side and is extended up to on the elastic film 50 or on the insulating film provided as necessary, is connected to each second electrode 80 that is an individual electrode of the piezoelectric element 300.

A protective substrate 30 having the manifold portion 31 that configures at least a portion of a manifold 100 is bonded through an adhesive 35 on the flow channel forming substrate 10 on which the piezoelectric element 300 is formed, that is, on the first electrode 60, the elastic film 50 or the insulating film provided as necessary, and the lead electrode 90. In the present embodiment, the manifold portion 31 penetrates the protective substrate 30 in the thickness direction, is formed along the width direction of the pressure generating chambers 12, and is communicated with the communication portion 13 in the flow channel forming substrate 10 as described above, thereby forming the manifold 100 which is the common ink chamber of each pressure generating chamber 12. Only the manifold portion 31 may be used as the manifold by dividing the communication portion 13 in the flow channel forming substrate 10 into plural sections for each of the pressure generating chambers 12. Furthermore, for example, the ink supply channel 14 communicating the manifold 100 and each of the pressure generating chambers 12 to members interposed between the flow channel forming substrate 10 and the protective substrate 30 (for example, the elastic film 50, the insulating film provided as necessary, and the like) may be provided by providing only the pressure generating chambers 12 in the flow channel forming substrate 10.

In addition, a piezoelectric element holding portion 32 having a space that does not hinder the movement of the piezoelectric element 300 is provided in a region on the protective substrate 30 which faces the piezoelectric element 300. The piezoelectric element holding portion 32 simply may have a space that does not hinder the movement of the piezoelectric element 300, and the space may or may not be sealed.

It is preferable that materials having substantially the same coefficient of thermal expansion as the flow channel forming substrate 10 be used as such a protective substrate 30, for example, glass, ceramic materials, and the like, and the protective substrate was formed using a silicon single crystal substrate of the same material as the flow channel forming substrate 10 in the present embodiment.

A through hole 33 that penetrates the protective substrate 30 in the thickness direction is provided in the protective substrate 30. Then, the through hole 33 is provided so that the vicinity of the end portion of the lead electrode 90 drawn from each of the piezoelectric elements 300 is exposed in the through hole 33.

A driving circuit 120 for driving the piezoelectric elements 300 provided in parallel is fixed on the protective substrate 30. It is possible to use, for example, a circuit substrate, a semiconductor integrated circuit (IC), and the like as the driving circuit 120. Then, the driving circuit 120 and the lead electrode 90 are electrically connected via a connecting wire 121 formed from a conductive wire, such as a bonding wire.

A compliance substrate 40 formed of a sealing film and a fixing plate 42 is bonded to the protective substrate 30. The sealing film 41 is formed of a material having low stiffness and flexibility, and one surface of the manifold portion 31 is sealed by the sealing film 41. The fixing plate 42 is formed of a comparatively hard material. Since the region of the fixing plate 42 facing the manifold 100 forms an opening portion 43 that is completely removed in the thickness direction, the one surface of the manifold 100 is sealed only by the sealing film 41 having flexibility.

In the ink jet recording head I of the embodiment, ink is drawn in from an ink introduction port connected with an external ink supply, not shown, a voltage is applied between each pair of the first electrode 60 and the second electrode 80 corresponding to the pressure generating chamber 12 according to recording signals from the driving circuit 120 after the interior from the manifold 100 to the nozzle openings 21 is filled with the ink, and the elastic film 50, the adhesive layer 56, the first electrode 60, and the piezoelectric layer 70 are flexurally deformed, thereby increasing the pressure in each of the pressure generating chambers 12 and discharging ink droplets from the nozzle openings 21.

Next, an example of the manufacturing method of the ink jet recording head of the embodiment will be described with reference to FIGS. 4A to 8B. FIGS. 4A to 8B are cross-sectional views of the pressure generating chamber in the longitudinal direction. In the embodiment, a case of forming the complex oxide including Bi, Fe, Ba and Ti as the complex oxide layer 74 is given as an example.

Figure 4A:
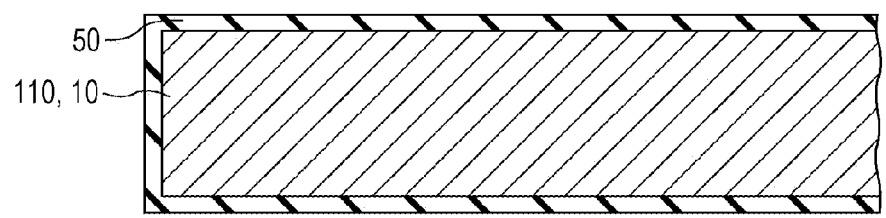
FIGS. 4A and 4B are cross-sectional views showing a manufacturing step of the recording head according to Embodiment 1.
Figure 4B:
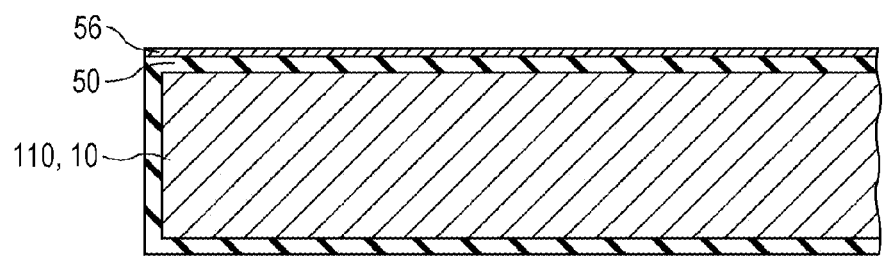

Firstly, as shown in FIG. 4A, a silicon dioxide film formed from silicon dioxide ($SiO_2$) or the like configuring the elastic film 50 is formed on the surface of a flow channel forming substrate wafer 110 that is a silicon wafer by thermal oxidation or the like. Next, as shown in FIG. 4B, the adhesive layer 56 formed from titanium oxide or the like is formed on the elastic film 50 (silicon dioxide film) by a sputtering method, thermal oxidation, or the like.

Figure 5A:
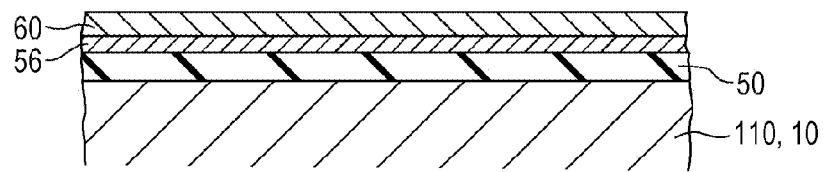
FIGS. 5A to 5D are cross-sectional views showing a manufacturing step of the recording head according to Embodiment 1.
Figure 5B:
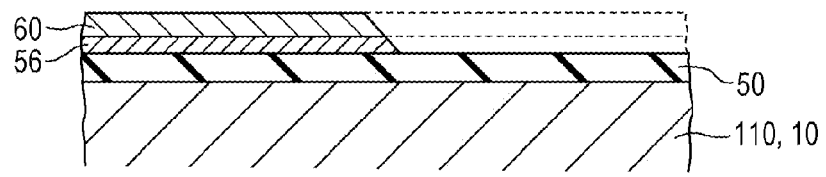

Next, as shown in FIG. 5A, the first electrode 60 formed from platinum is formed by a sputtering method or a vapor deposition method over the entire surface of the adhesive layer 56. Next, as shown in FIG. 5B, a resist (not shown) with a predetermined shape is patterned as a mask at the same time on the first electrode 60 so that the side surfaces of the adhesive layer 56 and the first electrode 60 are inclined.

Next, after removal of the resist, a buffer layer precursor film 71 is formed on the first electrode 60. The buffer layer precursor film 71 may be manufactured using a chemical solution methods, such as a metal-organic decomposition (MOD) method or a sol-gel method, in which a buffer layer 72 formed from a metal oxide is obtained by coating, drying and then firing at high temperatures a solution including a metal complex. Additionally, the buffer layer 72 may be manufactured using methods, such as a laser ablation method, a sputtering method, a pulse laser deposition (PLD) method, a CVD method and an aerosol deposition method.

Figure 5C:
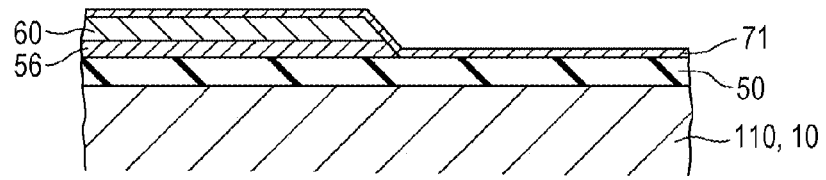

As a specific example of the formation procedure in a case in which the buffer layer 72 is formed with a chemical solution method, first, as shown in FIG. 5C, a buffer layer precursor film 71 is formed by coating a buffer layer forming composition (buffer layer precursor solution) formed from an MOD solution or sol including a metal complex on the first electrode 60 formed from Pt, using a spin coating method (buffer layer precursor solution coating step).

The coated buffer layer precursor solution is obtained by mixing a complex oxide including bismuth and manganese, that is, a metal complex able to be formed from bismuth manganate through firing, and dissolving or dispersing the mixture in an organic solvent. As metal complexes including Bi and Mn, respectively, alkoxides, organic acid salts, β diketone complexes and the like may be used. Examples of the metal complex including Bi include, for example, bismuth 2-ethylhexanoate and bismuth acetate. Examples of the metal complex including Mn, for example, manganese 2-ethylhexanoate and manganese acetate. Naturally, a metal complex including two or more of Bi and Mn may be used. Examples of the solvent of the buffer layer precursor solution include, propanol, butanol, pentanol, hexanol, octanol, ethylene glycol, propylene glycol, octane, decane, cyclohexane, xylene, toluene, tetrahydrofuran, acetic acid, and octylic acid.

In this way, in the preparation of the buffer layer 72, for example, a precursor solution including the Bi and Mn metal complexes is used, and this may be coated and fired on the first electrode 60 formed from Pt. The composition of the materials of the precursor solution and the like is not particularly limited, and be mixed to attain a desired molar ratio of each metal.

Next, the buffer layer precursor film 71 is dried for a predetermined time by heating to a predetermined temperature (for example, 150° C. to 200° C.) (buffer layer drying step). Next, the dried buffer layer precursor film 71 is degreased by being heated to a predetermined temperature (for example, 350° to 450° C.) and held at the temperature for a predetermined time (buffer layer degreasing step). Here, the term degreasing indicates removing organic components included in the buffer layer precursor film 71 as $NO_2$, $CO_2$, and $H_2O$. The atmosphere in the buffer layer drying step and the buffer layer degreasing step is not limited, and the steps may be performed in the atmosphere, an oxygen atmosphere or an inert gas.

Figure 5D:
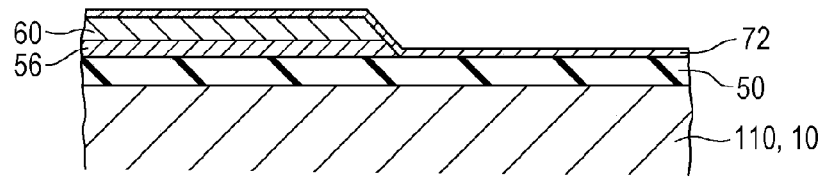

Next, as shown in FIG. 5D, the buffer layer precursor film 71 is heated to a predetermined temperature, for example, approximately 600° C. to 850° C. and crystallized by being held at the temperature for a predetermined amount of time, for example, 1 minute to 10 minutes, thereby forming the buffer layer 72 formed from a complex oxide including bismuth and manganese (firing step).

The atmosphere in the buffer layer firing step is also not limited, and the atmosphere, an oxygen atmosphere, or an inert gas atmosphere may also be used. Examples of a heating apparatus that is used in the buffer layer drying step, the buffer layer degreasing step, and the buffer layer firing step include, for example, a rapid thermal annealing (RTA) apparatus that carries out heating by irradiation of an infrared lamp or a hot plate.

In the embodiment, although a buffer layer 72 formed from a single layer is formed through one coating step, a buffer layer 72 formed from multiple layers may be formed by repeating the above-described buffer layer coating step, buffer layer drying step, and buffer layer degreasing step, or the buffer layer coating step, buffer layer drying step, buffer layer degreasing step, and buffer layer firing step a plurality of times according to the desired thickness or the like.

Next, a complex oxide layer 74 formed from a complex oxide including Bi, Fe, Ba and Ti is formed on the buffer layer 72. It is possible to prepare the complex oxide layer 74 by, for example, coating and drying a solution including a metal complex and then performing degreasing. In addition, the complex oxide layer 74 can be manufactured using methods such as a laser ablation method, a sputtering method, a pulse laser deposition (PLD) method, a CVD method and an aerosol deposition method.

Figure 6A:
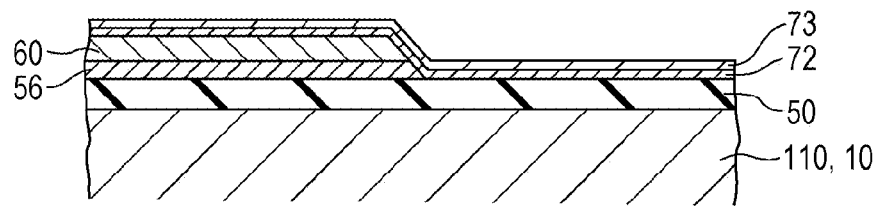
FIGS. 6A to 6C are cross-sectional views showing a manufacturing step of the recording head according to Embodiment 1.

As a specific example of the procedure of a case in which the complex oxide layer 74 is formed by a chemical solution method, firstly, a precursor film (complex oxide precursor film) 73 for the complex oxide layer 74 is formed on the buffer layer 72 by coating an oxide layer forming composition (precursor solution) formed from an MOD solution or a sol including a metal complex, specifically a metal complex containing Bi, Fe, Ba and Ti, using a spin coating method or the like, as shown in FIG. 6A (coating step).

The coated precursor solution is obtained by mixing a metal complex able to be formed from a complex oxide including Bi, Fe, Ba and Ti through firing, and dissolving or dispersing the mixture in an organic solvent. In a case in which the complex oxide layer 74 formed from a complex oxide including Mn, Co or Cr is formed, a precursor solution containing a metal complex having Mn, Co or Cr is used. The mixing ratio of the metal complexes having metal complexes respectively including Bi, Fe, Ba, Ti, Mn, Co and Cr may be mixed to attain a desired molar ratio of each metal. Examples of the metal complexes including Bi, Fe, Ba, Ti, Mn, Co and Cr respectively that may be used include metal alkoxides, organic acid salts, β diketone complexes, and the like. Examples of the metal complex including Bi include, for example, bismuth 2-ethylhexanoate and bismuth acetate. Examples of the metal complex including Fe include, for example, iron 2-ethylhexanoate, iron acetate and iron tris (acetylacetonate). Examples of the metal complex including Ba include, for example, barium isopropoxide, barium 2-ethylhexanoate and barium acetylacetonate. Examples of the metal complex containing Ti include, for example, titanium isopropoxide, titanium 2-ethylhexanoate, and titanium (di-i-propoxide)bis(acetylacetonate). Examples of the metal complex including Mn include, for example, manganese 2-ethylhexanoate and manganese acetate. Examples of the organic metallic compound including Co include, for example, cobalt 2-ethylhexanoate, and cobalt (III) acetylacetonate. Examples of the organic metallic compound including Cr include chromium 2-ethylhexanoate. Naturally, metal complexes including two or more types of Bi, Fe, Ba, Ti, Mn, Co and Cr may be used. Examples of the solvent of the precursor solution include, propanol, butanol, pentanol, hexanol, octanol, ethylene glycol, propylene glycol, octane, decane, cyclohexane, xylene, toluene, tetrahydrofuran, acetic acid, and octylic acid.

Next, the complex oxide precursor film 73 is heated to a predetermined temperature (for example, 150° C. to 200° C.) and dried for a fixed amount of time (drying step). Next, the dried complex oxide precursor film 73 is heated to a predetermined temperature (for example, 350° C. to 450° C.) and held for a fixed amount of time, thereby carrying degreasing (degreasing step). Here, the term degreasing indicates removing organic components included in the complex oxide precursor film 73 as $NO_2$, $CO_2$, and $H_2O$. The atmosphere in the drying step or the degreasing step is not limited, and the atmosphere, an oxygen atmosphere, or an inert gas may also be used. The coating step, the drying step, and the degreasing step may be carried out multiple times.

Figure 6B:
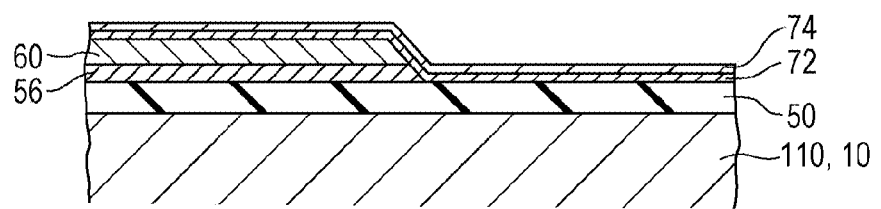

Next, as shown in FIG. 6B, the complex oxide precursor film 73 is heated to a predetermined temperature, for example, 600 to 850° C., and held for a fixed amount of time, for example, 1 minute to 10 minutes, thereby carrying out firing (firing step). In so doing, the layer is crystallized, thereby becoming a complex oxide layer 74 formed from a complex oxide having a perovskite structure including Bi, Fe, Ba and Ti. The atmosphere in the firing step is also not limited, and the atmosphere, an oxygen atmosphere, or an inert gas may also be used. Examples of a heating apparatus that is used in the drying step, the degreasing step, and the firing step include, for example, a rapid thermal annealing (RTA) apparatus that carries out heating by irradiation of an infrared lamp or a hot plate.

Figure 6C:
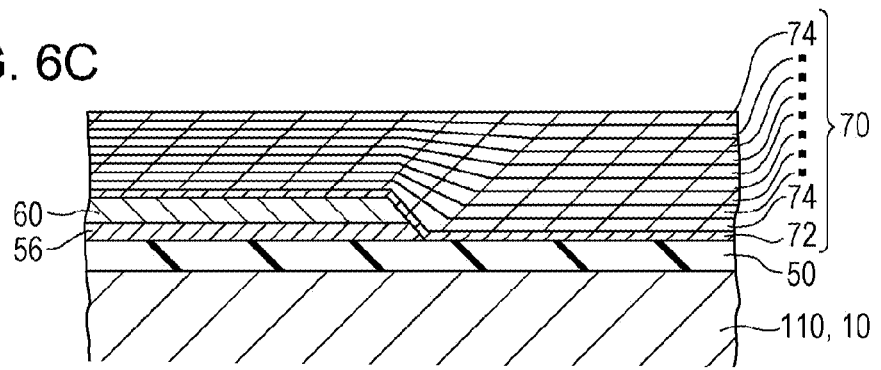

Next, the piezoelectric layer 70 with a predetermined thickness formed from the buffer layer 72 and multiple layers of the complex oxide layer 74 is formed, as shown in FIG. 6C, by forming multiple layers of the complex oxide layer 74 by repeating the coating step, the drying step and the degreasing step, or the coating step, the drying step, the degreasing step, and the firing step multiple times according to the desired film thickness and the like. For example, in a case of a film thickness of approximately 0.1 μm for each coating step of the coating solution, for example, the total film thickness of one layer of the buffer layer 72 and the piezoelectric layer 70 formed from 10 layers of the complex oxide layer 74 is approximately 1.0 μm. In the embodiment, although the complex oxide layers 74 are provided arranged in layers, only one layer may also be used.

In this way, when the buffer layer 72 formed from a complex oxide including bismuth and manganese is formed, the piezoelectric layer 70 in which complex oxides layers 74 including Bi, Fe, Ba and Ti are layered and formed on the buffer layer 72 is a film strongly aligned in the (100) plane as described above. The average grain size of the crystal grains of the piezoelectric layer 70 of the embodiment aligned in a planar direction within 15° from the (100) plane is smaller than the average grain size of the crystal grains facing a planar direction inclined by more than 15° from the (100) plane. In so doing, the crystal grains in the planar direction substantially matching the (100) plane become minutely small, and the degree of alignment of the (100) plane of the piezoelectric layer 70 is further improved. The piezoelectric layer 70 with an improved degree of alignment of the (100) plane is able to exhibit better piezoelectric characteristics than a case in which the alignment is random or a case in which a plurality of alignments are mixed. As a result, the piezoelectric characteristics of the piezoelectric layer 70 having a complex oxide layer 74 of the embodiment become excellent.

Figure 7A:
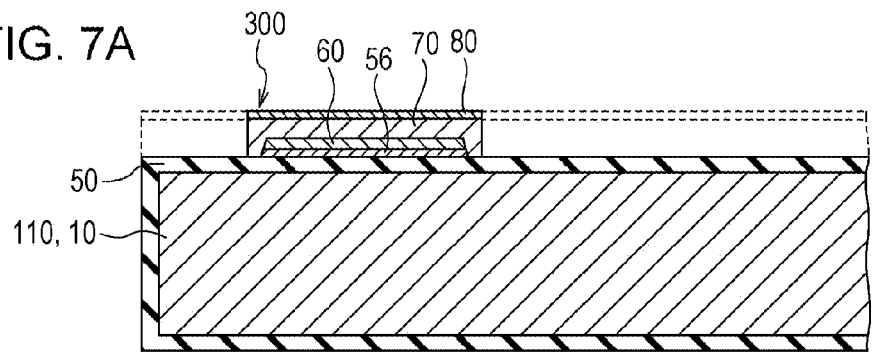
FIGS. 7A to 7C are cross-sectional views showing a manufacturing step of the recording head according to Embodiment 1.

After the piezoelectric layer 70 is formed, as shown in FIG. 7A, the second electrode 80 formed from platinum or the like is formed on the piezoelectric layer 70 by a sputtering method or the like, and the piezoelectric layer 70 and the second electrode 80 are patterned at the same time in the area facing each of the pressure generating chambers 12, thereby forming the piezoelectric element 300 having the first electrode 60, the piezoelectric layer 70, and the second electrode 80. The patterning of the piezoelectric layer 70 and the second electrode 80 can be carried out in a batch by dry etching via a resist formed in a predetermined shape (not shown). Thereafter, annealing may be carried out as necessary in a temperature range of, for example, 600° C. to 850° C. Thereby, it is possible to form favorable interfaces between the piezoelectric layer 70, the first electrode 60, and the second electrode 80, and to further improve the crystallinity of the piezoelectric layer 70.

Figure 7B:
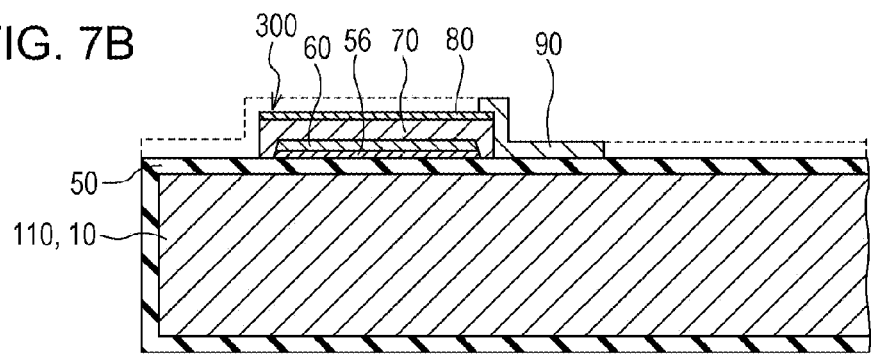

Next, as shown in FIG. 7B, after the lead electrode formed from, for example, silver (Au) or the like is formed over the entire surface of the flow channel forming substrate wafer 110, patterning is carried out for each of the piezoelectric elements 300 via, for example, a mask pattern (not shown) formed from a resist and the like.

Figure 7C:
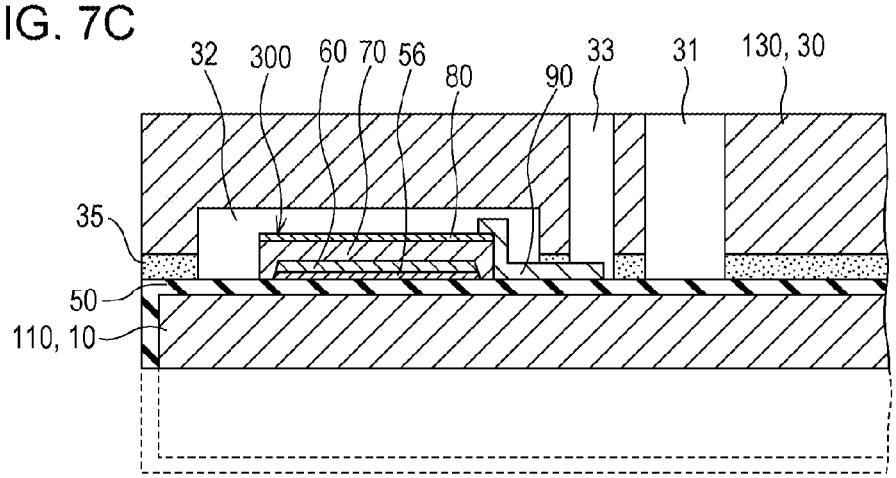

Next, after a protective substrate wafer 130 formed from a plurality of the protective substrates 30 that are silicon wafers is joined on the piezoelectric element 300 side of the flow channel forming substrate wafer 110 via the adhesive 35 as shown in FIG. 7C, the flow channel forming substrate wafer 110 thinned to a predetermined thickness.

Figure 8A:
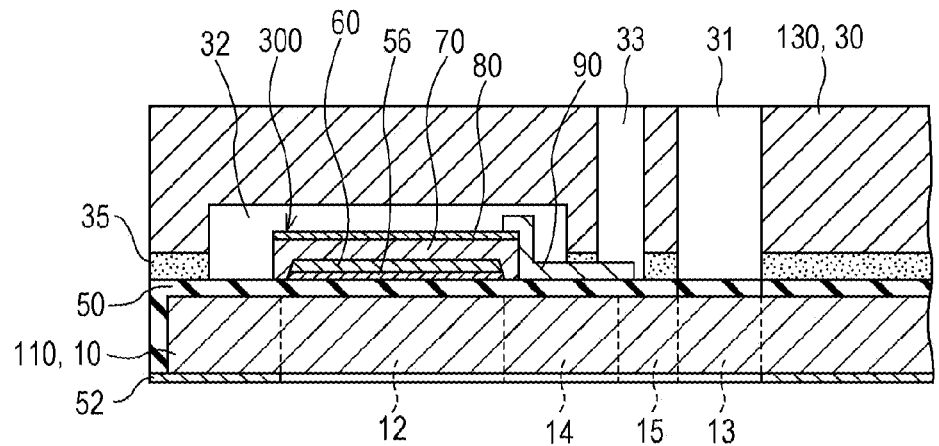
FIGS. 8A and 8B are cross-sectional views showing a manufacturing step of the recording head according to Embodiment 1.
Figure 8B:
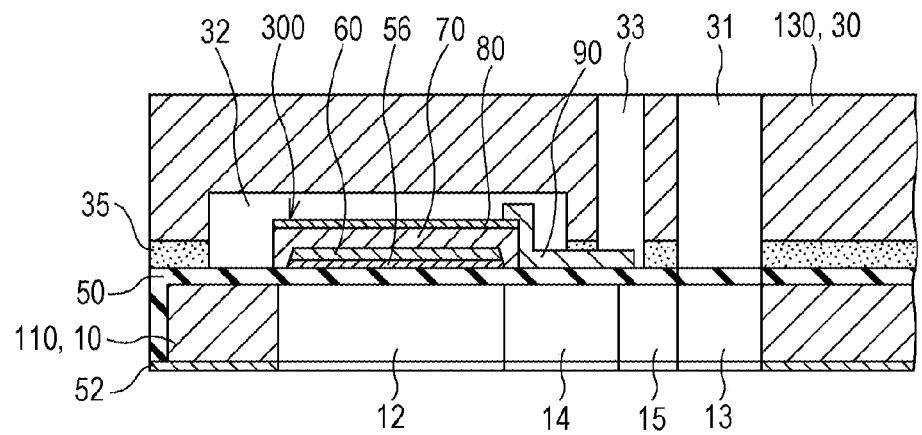

Next, a mask film 52 is newly formed on the flow channel forming substrate wafer 110 as shown in FIG. 8A, and is patterned into a predetermined shape. In addition, the pressure generating chambers 12, the communication portion 13, the ink supply channel 14, the communication channel 15, and the like, corresponding to the piezoelectric elements 300, are formed by carrying out anisotropic etching (wet etching) on the flow channel forming substrate wafer 110 via the mask film 52 using an alkali solution, such as KOH as shown in FIG. 8B.

After that, unnecessary portions in the outer circumferential portions of the flow channel forming substrate wafer 110 and the protective substrate wafer 130 are removed by performing cutting using, for example, dicing or the like. In addition, after the mask film 52 on the surface of the flow channel forming substrate wafer 110 on the opposite side of the protective substrate wafer 130 is removed, the nozzle plate 20 in which the nozzle openings 21 are punctured is bonded, and the compliance substrate 40 is bonded to the protective substrate wafer 130, and the flow channel forming substrate wafer 110 and the like are divided into flow channel forming substrates 10 and the like of one chip size as shown in FIG. 1, thereby manufacturing the ink jet recording head I of the embodiment.

EXAMPLES

Below, examples are shown, and the invention will be described more specifically. The invention is not limited to the following examples.

Example 1

First, a 1200 nm thick silicon oxide ($SiO_2$) film was formed on the surface of a (100) single crystal silicon (Si) substrate by thermal oxidation. Next, a 40 nm thick titanium film was formed on the $SiO_2$ film with a RF magnetron sputtering method, and titanium oxide film was formed by thermal oxidation. Next, a 100 nm thick platinum film (first electrode 60) aligned in the (111) plane was formed on the titanium oxide film by an RF magnetron sputtering method.

Next, the buffer layer 72 that includes Bi and Mn was formed on the first electrode 60. The method was as follows. First, an n-octane solution of bismuth 2-ethyl hexanoate and manganese 2-ethyl hexanoate was mixed so as to attain a molar concentration ratio of Bi:Mi=1:1, thereby preparing a buffer layer precursor solution.

Next, the buffer layer precursor solution was added dropwise to the substrate with attached electrode, and a buffer layer precursor film was formed by a spin coating method in which the substrate is rotated at 3000 rpm (buffer layer coating step).

Next, the substrate was dried at 180° C. for 2 minutes on a hot plate (buffer layer drying step). Next, degreasing was performed at 350° C. for 2 minutes (buffer layer degreasing step). Thereafter, the temperature was raised to 700° C. at 3° C./sec, and a 10 nm thick buffer layer 72 formed from bismuth mangante was formed by performing firing at 700° C. for 2 minutes in an oxygen atmosphere with a rapid thermal annealing (RTA) apparatus (buffer layer firing step).

Next, a complex oxide layer 74 is formed on the buffer layer 72. The method was as follows. Firstly, each n-octane solution of bismuth 2-ethylhexanoate, iron 2-ethylhexanoate, barium 2-2-ethylhexanoate, titanium 2-ethylhexanoate and manganese ethylhexanoate were mixed such that the molar ratio of each element became Bi:Fe:Ba:Ti:Mn=75:71.25:25:25:3.75, thereby preparing precursor solution.

Next, the precursor solution was added dropwise on the buffer layer 72, and a complex oxide precursor film 73 was formed by a spin coating method in which the substrate with attached electrode is rotated at 3000 rpm for 20 seconds after rotating the substrate with attached electrode at 500 rpm for 5 seconds (coating step). Next, drying was performed at 180° C. for 2 minutes on a hot plate (drying step). Next, degreasing was carried out at 350° C. for 2 minutes (degreasing step). Thereafter, the temperature was raised to 750° C. at 400° C./sec, the layer was crystallized by being fired at 750° C. for 2 minutes with an RTA apparatus in an oxygen atmosphere, thereby forming a complex oxide layer 74 formed from a complex oxide having a perovskite structure including Bi, Fe, Ba, Ti and Mn (firing step). Thereafter, the firing step was performed after repeating the complex oxide layer precursor film coating step, drying step and degreasing step twice, from coating to firing was repeated 5 times, and the firing step was performed after the complex oxide layer precursor film coating step, drying step and degreasing step were performed, thereby forming a 900 nm thick piezoelectric layer 70 formed from a buffer layer 72 and 11 complex oxide layers 74.

Comparative Example 1

Instead of a buffer layer 72, a lanthanum nickelate layer was formed, and an approximately 900 nm thick piezoelectric layer formed from a lanthanum nickelate film and 12 complex oxide layers is formed with the same procedure as Example 1 other than 12 complex oxide layers being laminated on the lanthanum nickelate film.

The lanthanum nickelate film was formed with the procedure below. lanthanum acetylacetonate (lanthanum acetylacetonate dihydrate $(La(acac)_3).2H_2O$) and nickel acetylacetonate (nickel acetylacetonate dihydrate $[Ni(accac)_2]_3.2H_2O$) were added to a beaker such that the lanthanum and nickel each reach 0.005 mol. Thereafter, 25 ml of an acetic acid aqueous solution (acetic acid: 99.7 mass %), and a further 5 ml of water was added and mixed. Thereafter, the solution was heated with a hot plate so that the temperature thereof reached 70° C., and the lanthanum nickelate film forming precursor solution was prepared by being stirred under heating for approximately 1 hour.

After the lanthanum nickelate film forming precursor solution was formed as a film by a spin coater on the substrate with an attached electrode, the film was fired on a hot plate at 180° C.×3 min, then at 350° C.×3 min, thereby forming an amorphous film. Next, the amorphous film was fired at 700° C.×5 min using a lamp annealing furnace, thereby forming a 40 nm thick lanthanum nickelate film formed from an oxide including Ni and La.

Test Example 1

Figure 9:
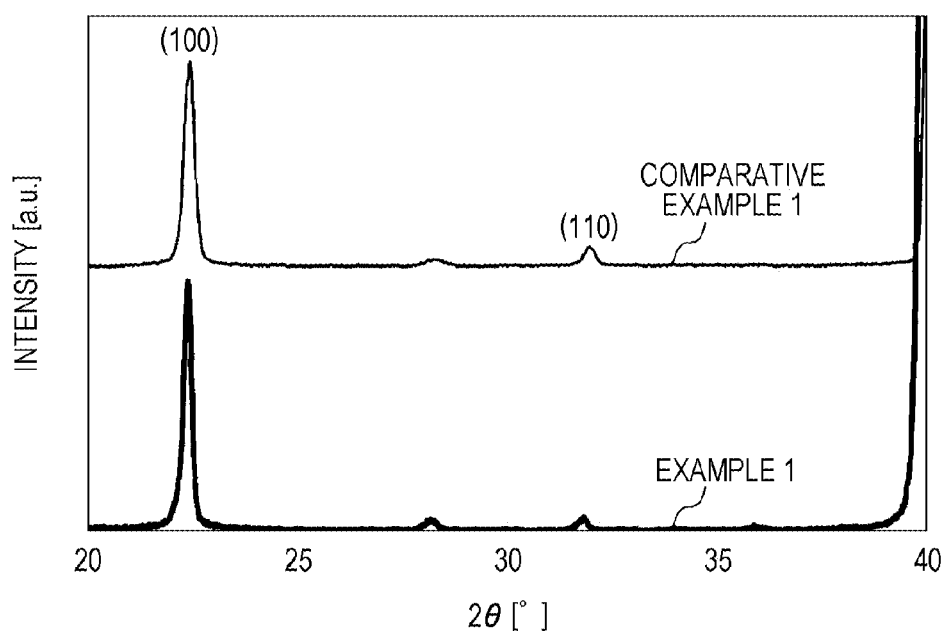
FIG. 9 is a diagram showing an X-ray diffraction peak of the piezoelectric layers of Example 1 and Comparative Example 1.

The piezoelectric layers of Example 1 and Comparative Example 1 were measured by X-ray diffraction using a "D8 Discover" manufactured by Bruker AXS K.K., and an orientation mapping of the piezoelectric layers of Example 1 and Comparative Example 1 was measured using a "Nordlys S: electron beam backscatter diffraction method (EBSD)" manufactured by Oxford Instruments. FIG. 9 shows the measurement results of the X-ray diffraction. FIGS. 10A to 10C and 11A to 11C respectively show an overall orientation mapping of the piezoelectric layers of Example 1 and Comparative Example 1, an orientation mapping of the crystal grains aligned in a planar direction within 15° from the (100) plane, and an orientation mapping of the crystal grains facing a planar direction inclined by more than 15° from the (100) plane.

First of all, the measurement results of the X-ray diffraction will be described. As shown in FIG. 9, a strong peak showing the (100) plane is recognized in the piezoelectric layers of both Example 1 and Comparative Example 1. In so doing, it can be understood that the crystals of the piezoelectric layers of Example 1 and Comparative Example 1 are strongly aligned in the (100) plane.

Figure 10A:
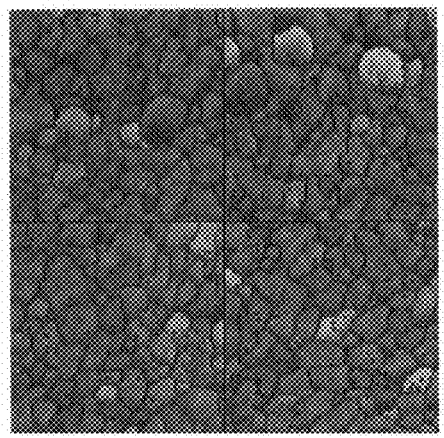
FIGS. 10A to 10C are orientation mappings of the crystal grains of the piezoelectric layer of Example 1.
Figure 10B:
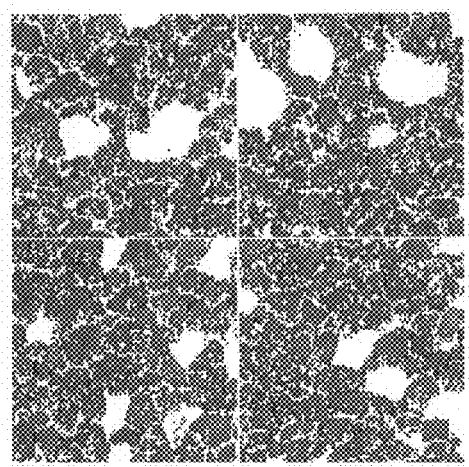
Figure 10C:
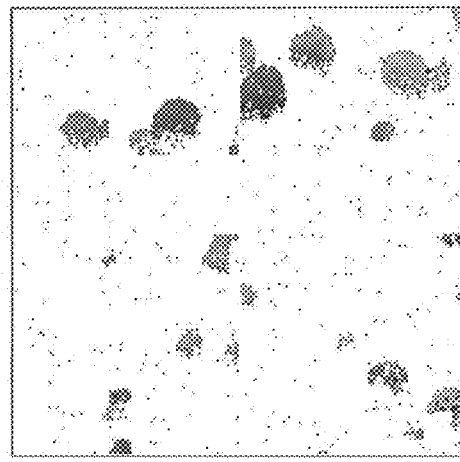
Figure 11A:
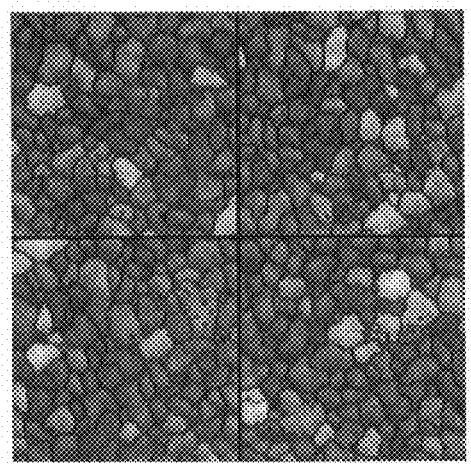
FIGS. 11A to 11C are orientation mappings of the crystal grains of the piezoelectric layer of Comparative Example 1.
Figure 11B:
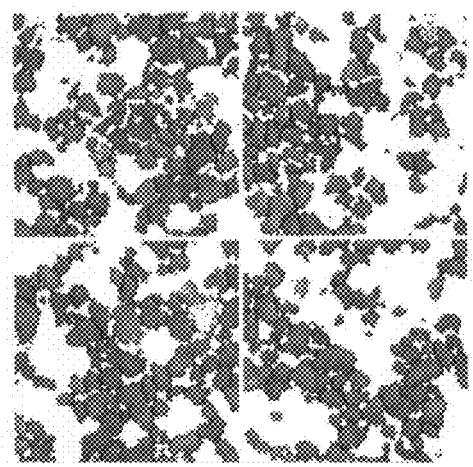
Figure 11C:
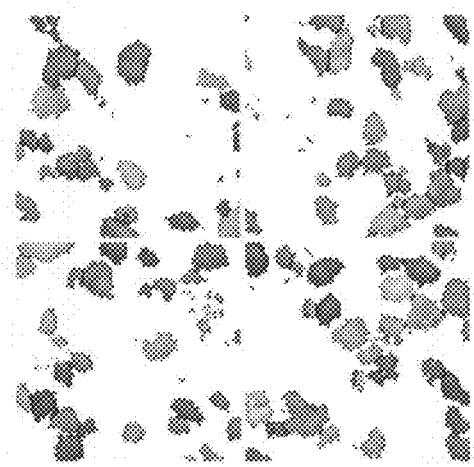

Next, the orientation mapping will be described. As shown in FIG. 10A, the crystal grains of the piezoelectric layer of Example 1 includes a majority of small crystal grains, and a small portion of large crystal grains. It can be understood in light of FIG. 10B that the small crystal grains are aligned in a planar direction within 15° from the (100) plane, and are minutely small and have a uniform size. Meanwhile, it can be understood in light of FIG. 10C that the large crystal grains face a planar direction inclined by more than 15° from the (100) plane. As shown in FIGS. 11A to 11C, it can be understood that the crystal grains of the piezoelectric layer of Comparative Example 1 are an uneven distribution of small crystal grains aligned in a planar direction within 15° of the (100) plane and large grains facing a planar direction inclined by more than 15° from the (100) plane.

In light of the above results, it can be understood that the piezoelectric layer of Example 1 is a film with a more dense crystallinity and for which the degree of alignment of the (100) plane is remarkably improved. Meanwhile, it can be understood that although the piezoelectric layer of Comparative Example 1 is aligned in the (100) plane, because the size of the crystal grains is uneven, the degree of alignment of the (100) plane is inferior to the piezoelectric layer of Example 1. In so doing, it can be understood that the piezoelectric layer of Example 1 is able to exhibit excellent piezoelectric characteristics.

Test Example 2

Figure 12:
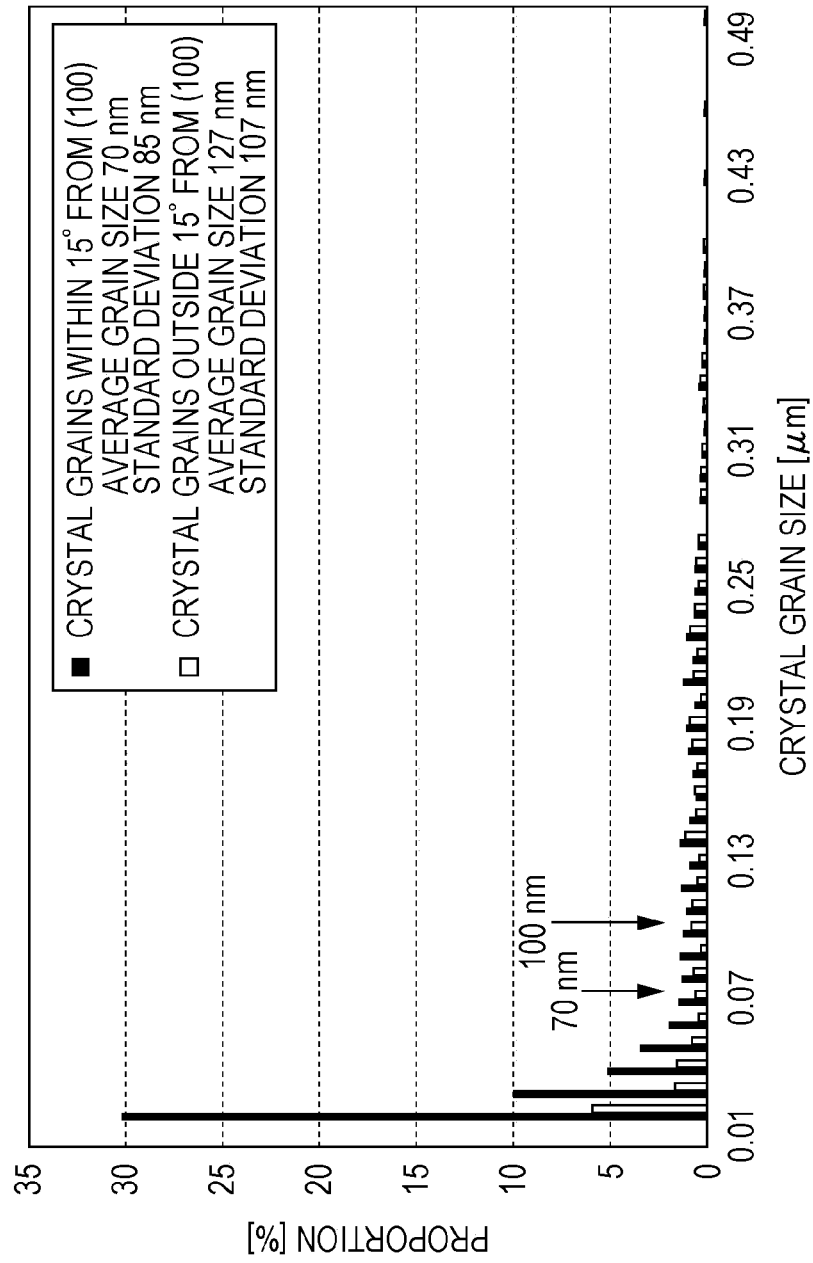
FIG. 12 is a grain size histogram representing the distribution state of crystal grain size of the piezoelectric layer of Example 1.

Through image analysis of the orientation mapping indicating the crystal orientation obtained by EBSD of Test Example 1, the crystal grain size of the piezoelectric layers of the Example 1 and Comparative Example 1 is measured and the respective average grain sizes and standard deviations are calculated from the crystal grain sizes. The crystal grain sizes were measured by in 2° increments of the radius passing through the center of gravity of the crystal grains for each collection of crystal grains from the orientation mapping, and the average of the radii was calculated. The distribution state of the crystal grain sizes is represented as a grain size histogram. FIG. 12 is a grain size histogram representing the distribution state of crystal grain sizes in the piezoelectric layer of Embodiment 1.

As shown in FIG. 12, the average grains size and the standard deviation of the crystal grains aligned in a planar direction within 15° from the (100) plane of the piezoelectric layer of Example 1 become 70 nm and 85 nm respectively, and the average grain size and the standard deviation of the crystal grains facing planar direction other than 15°, that is, more than 15° from the (100) plane respectively become 127 nm and 107 nm. In light of the crystal grain histogram in FIG. 12, it can be seen that 50% or more the crystal grains aligned in a planar direction within 15° from the (100) plane of the piezoelectric layer have an average grain size of less than 70 nm, and 14% or less of the crystal grains facing a planar direction inclined by more than 15° from the (100) plane have an average grain size of 100 nm or more. In so doing, the crystal grains of the piezoelectric layer become extremely minute and the density of the crystallinity becomes favorable. As a result, it is presumed that the degree of alignment of the (100) plane of the piezoelectric layer of Example 1 is improved, and the piezoelectric characteristics are remarkably improved.

Furthermore, it can be understood when the ratio of the number of crystal grains aligned in a planar direction within 15° from the (100) plane and the number of crystal grains facing a planar direction inclined by more than 15° from the (100) plane (number of crystal grains facing within 15° from the (100) plane)/(number of crystal grains inclined by more than 15° from the (100))) is taken for each of FIGS. 10A to 10C and FIGS. 11A to 11C, the ratios were 1.6 in Comparative Example 1 and 2.8 in Example 1, and differ greatly from the measurement results using X-rays of Test Example 1. That is, it can be understood that although either of the piezoelectric layers of Example 1 and Comparative Example 1 are aligned in the (100) plane according to the measurement results using X-rays, the respective numbers of crystal grains differ greatly when the numbers of crystal gains inclined within 15° and by more than 15° from the (100) plane are analyzed in detail. In so doing, it can be understood that when the (number of crystal grains facing within 15° from the (100) plane/number of crystal grains inclined by more than 15° from the (100) plane) is 2.8 or more, the density of the crystallinity is favorable.

Other Embodiments

Above, an embodiment of the invention has been described; however, the basic configuration of the invention is not limited to the above. For example, although a silicon single crystal substrate was given as an example of the flow channel forming substrate 10 in the above-described embodiment, for example, materials, such as an SOI substrate and glass, may be used without being limited thereto.

Furthermore, although the piezoelectric element 300 in which the first electrode 60, the piezoelectric layer 70, and the second electrode 80 are sequentially laminated on a substrate (the flow channel forming substrate 10) was given as an example in the above-described embodiment, the piezoelectric element is not limited thereto, and, for example, it is also possible to apply the invention to a vertical vibration piezoelectric element in which a piezoelectric material and an electrode-forming material are alternately laminated such that the piezoelectric element expands and contracts in the axial direction.

Figure 13:
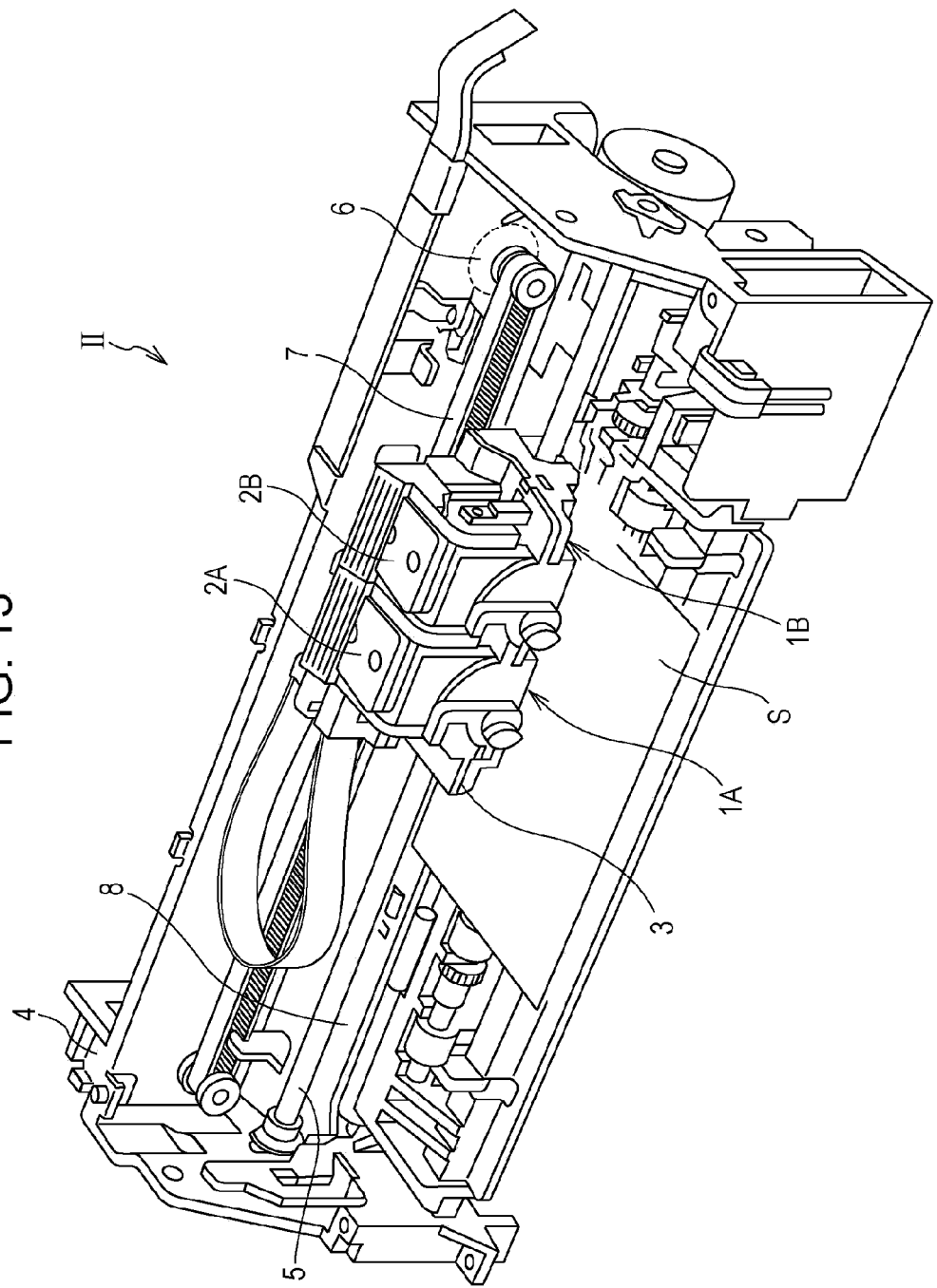
FIG. 13 is a view showing the schematic configuration of the recording apparatus according to an embodiment of the invention.

The ink jet recording head of the embodiment configures a part of the recording head unit equipped with ink flow channels communicated with an ink cartridge and the like, and is mounted to an ink jet recording apparatus. FIG. 13 is a schematic view showing an example of the ink jet recording apparatus.

In the ink jet recording apparatus II shown in FIG. 13, recording head units 1A and 1B having the ink jet recording head I are provided so that cartridges 2A and 2B that configure an ink supply may be attached and detached, and a carriage 3 having the recording head units 1A and 1B mounted thereon is provided so that the carriage is freely movable along the carriage shaft 5 that is attached to the apparatus main body 4. The recording head units 1A and 1B respectively eject a black ink composition and a color ink composition.

The carriage 3 having the recording head units 1A and 1B mounted thereon is moved along the carriage shaft 5 by transmitting the driving force of a driving motor 6 to the carriage 3 via a plurality of gears, which are not shown, and a timing belt 7. Meanwhile, a platen 8 is provided along the carriage shaft 5 in the apparatus main body 4, and a recording sheet S that is a recording medium, such as paper supplied by a paper supplying roller or the like, which is not shown, is rolled on the platen 8 and transported.

Although the ink jet recording head was described as an example of the liquid ejecting head in the above-described embodiment, the invention may be broadly applied to liquid ejecting heads as a whole, and, naturally, can also be applied to liquid ejecting heads that eject a liquid other than ink. Examples of other liquid ejecting heads include, for example, various recording heads that are used in image recording apparatuses, such as printers, color material ejecting heads used to manufacture color filters for liquid crystal displays or the like, electrode material ejecting heads used to form electrodes, such as organic EL displays and field emission displays (FED), and biological organic substance ejecting heads used to manufacture bio chips.

The piezoelectric element according to the invention is not limited to a piezoelectric element used in a liquid ejecting head, and may be used in other piezoelectric devices. Examples of the other devices include, for example, ultrasound devices, such as ultrasound transmitters, ultrasound motors, temperature-electric converters, pressure-electrical converters, ferroelectric transistors, piezoelectric transformers, and filters such as light blocking filters for harmful light rays, such as ultraviolet rays, optical filters using photonic crystal effects through formation of quantum dots, and optical filters using optical interference of thin films. The invention is also applicable to a piezoelectric element used as a sensor and a piezoelectric element used as a ferroelectric memory. Examples of sensors in which the piezoelectric element is used include, for example, infrared sensors, ultrasound sensors, thermosensitive sensors, pressure sensors, pyroelectric sensors and gyro sensors (angular velocity sensors).

The entire disclosure of Japanese Patent Application No. 2013-172617, filed Aug. 22, 2013, is expressly incorporated by reference herein.

What is claimed is:

1. A piezoelectric element comprising:
a first electrode;
a piezoelectric layer provided on the first electrode; and
a second electrode provided on the piezoelectric layer,
wherein an average grain size of crystal grains aligned in a planar direction within 15° from a (100) plane is less than the average grain size of the crystal grains facing a planar direction inclined by more than 15° from the (100) plane, in a case in which the crystal orientation of the piezoelectric layer is analyzed using an electron beam backscatter diffraction method (EBSD).

2. The piezoelectric element according to claim 1,
wherein the average grain size of the crystal grains aligned in the planar direction within 15° from the (100) plane is less than 100 nm, and
the average grain size of the crystal grains facing a planar direction inclined by more than 15° from the (100) plane is 100 nm or more.

3. The piezoelectric element according to claim 2,
wherein 50% or more of the crystal grains aligned in the planar direction within 15° from the (100) plane have a grain size of less than 70 nm, and
14% or less of the crystal grains facing a planar direction inclined by more than 15° from the (100) plane have a grain size of 100 nm or more.

4. The piezoelectric element according to claim 1, further comprising a buffer layer provided between the piezoelectric layer and the first electrode, the buffer layer including bismuth and manganese.

5. The piezoelectric element according to claim 1,
wherein the piezoelectric layer includes a perovskite structure including bismuth, iron, barium and titanium.

6. The piezoelectric element according to claim 1,
wherein the piezoelectric layer further includes manganese.

7. The piezoelectric element according to claim 1,
wherein a ratio between a number of crystal grains aligned in a planar direction within 15° from the (100) plane and a number of crystal grains facing a planar direction inclined by more than 15° from the (100) plane (number of crystal grains facing within 15° from the (100) plane/ number of crystal grains inclined by more than 15° from the (100) plane) is 2.8 or more.

8. A liquid ejecting head comprising the piezoelectric element according to claim 1.

9. A liquid ejecting apparatus comprising the liquid ejecting head according to claim 8.

10. A piezoelectric device comprising the piezoelectric element according to claim 1.

* * * * *